(12) United States Patent
Lee

(10) Patent No.: US 6,476,606 B2
(45) Date of Patent: Nov. 5, 2002

(54) METHOD FOR PARALLEL SPATIAL ENCODED MRI AND APPARATUS, SYSTEMS AND OTHER METHODS RELATED THERETO

(75) Inventor: Ray F Lee, Clifton-Park, NY (US)

(73) Assignee: Johns Hopkins University, Baltimore, MD (US)

(*) Notice: Subject to any disclaimer, the term of this patent is extended or adjusted under 35 U.S.C. 154(b) by 0 days.

(21) Appl. No.: 09/728,948

(22) Filed: Dec. 1, 2000

(65) Prior Publication Data

US 2001/0043068 A1 Nov. 22, 2001

Related U.S. Application Data

(60) Provisional application No. 60/169,029, filed on Dec. 3, 1999.

(51) Int. Cl.[7] .................................................. G01V 3/00
(52) U.S. Cl. ........................ 324/309; 324/307; 324/318
(58) Field of Search ................................. 324/309, 307, 324/318, 300, 314, 312, 322, 311, 302; 600/410

(56) References Cited

U.S. PATENT DOCUMENTS

| | | | | |
|---|---|---|---|---|
| 4,825,162 A | * | 4/1989 | Roemer et al. | 324/318 |
| 5,086,275 A | * | 2/1992 | Roemer | 324/309 |
| 5,499,629 A | * | 3/1996 | Kerr et al. | 600/410 |
| 5,910,728 A | * | 6/1999 | Sodickson | 324/309 |
| 6,028,428 A | * | 2/2000 | Cunningham et al. | 324/314 |
| 6,289,232 B1 | * | 9/2001 | Jakob et al. | 600/410 |
| 2001/0043068 A1 | * | 11/2001 | Lee | 324/309 |

OTHER PUBLICATIONS

An Analytical SMASH Procedure (ASP) for sensitivity–Encoded MRI by Ray F. Lee, Charles R. Westgate, Robert G. Weiss, and Paul A Bottomley Magnetic Resonance in Medicine vol. 43 pp. 716–725 published May 2000.*

* cited by examiner

*Primary Examiner*—Edward Lefkowitz
*Assistant Examiner*—Tiffany A. Fetzner
(74) *Attorney, Agent, or Firm*—Edwards & Angell, LLP; Peter F. Corless; William J. Daley, Jr.

(57) ABSTRACT

There is featured a method for parallel spatial encoding MR image data that is frequency-encoded and sensitivity-encoded that includes applying an analytical transform function to generate weighting coefficients for a given spatial harmonic order and detector index; generating linear combinations of the frequency-encoded and sensitivity-encoded MR image data to generate a set of spatial harmonics that can encode spatial frequencies; and applying at least a 1D Fourier transform to a k-space data set in which spatial frequency dimensions are fully encoded, thereby resulting in. an MR image of an observed object. The method includes synchronizing the MR image data signals to remove spatially-dependent phase errors using for example Fourier-Hilbert Transforms. The method yet further includes demodulating the modulation of generated high order harmonics. Also featured are systems, apparatuses and other processing methods.

28 Claims, 10 Drawing Sheets

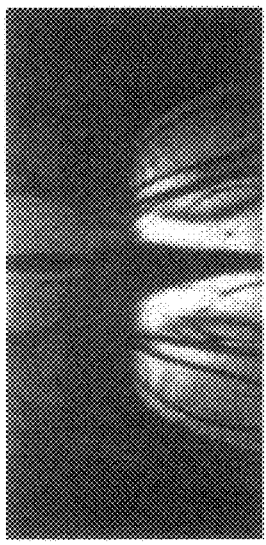   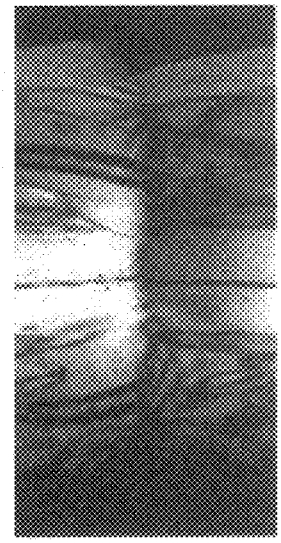
FIG. 6A    FIG. 6B    FIG. 6C    FIG. 6D
FIG. 6E

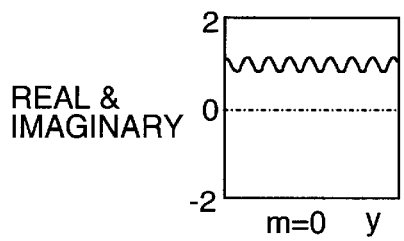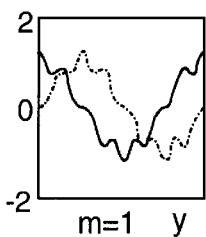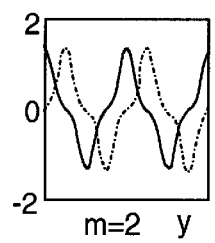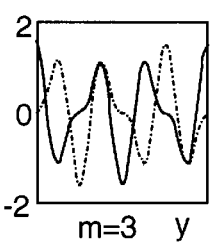
FIG. 7A  FIG. 7B  FIG. 7C  FIG. 7D
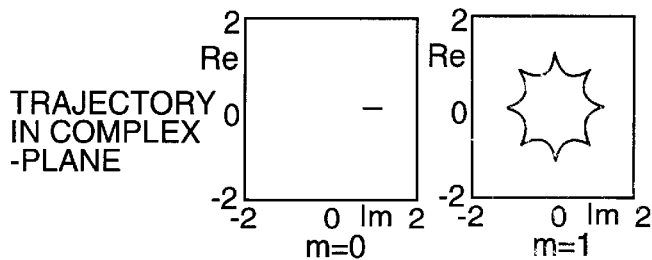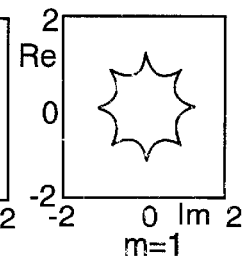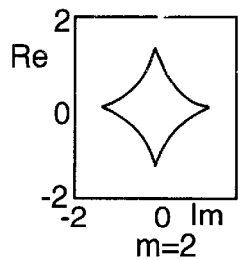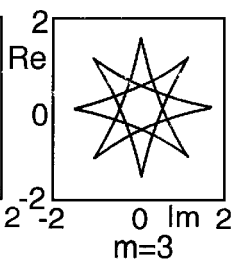
FIG. 8A  FIG. 8B  FIG. 8C  FIG. 8D
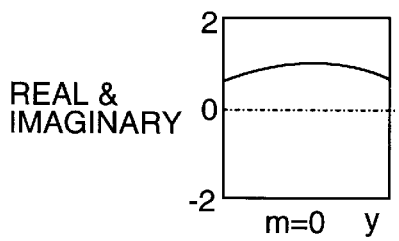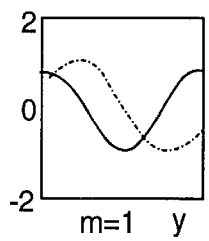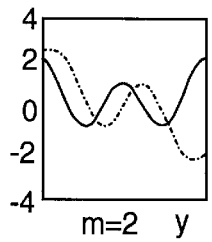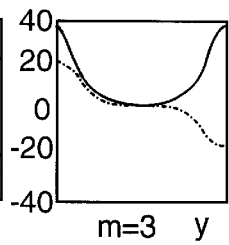
FIG. 9A  FIG. 9B  FIG. 9C  FIG. 9D
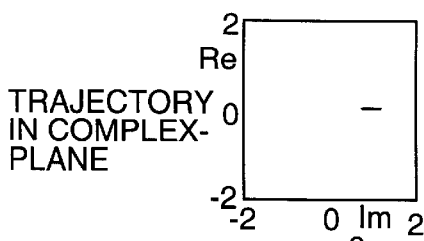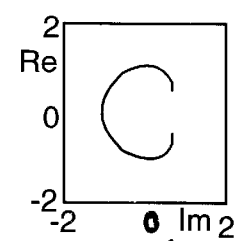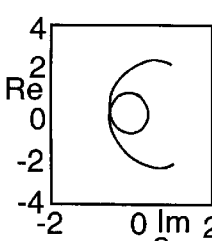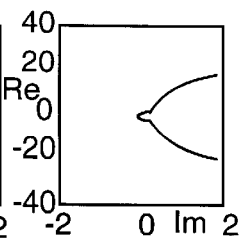
FIG. 10A  FIG. 10B  FIG. 10C  FIG. 10D

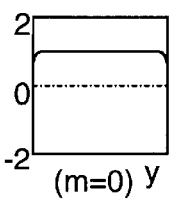
FIG. 13A (m=0) y
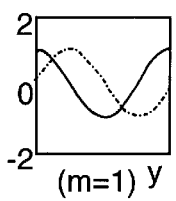
FIG. 13B (m=1) y
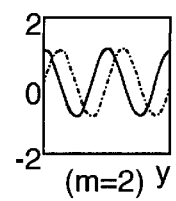
FIG. 13C (m=2) y
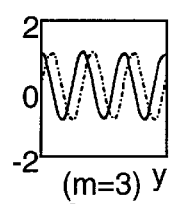
FIG. 13D (m=3) y
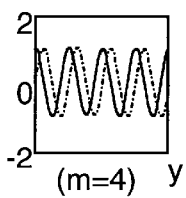
FIG. 13E (m=4) y
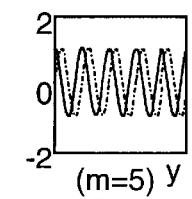
FIG. 13F (m=5) y
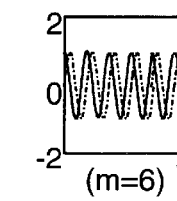
FIG. 13G (m=6) y
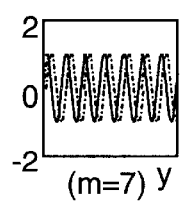
FIG. 13H (m=7) y
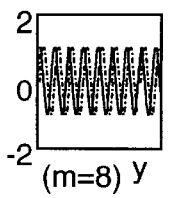
FIG. 13I (m=8) y
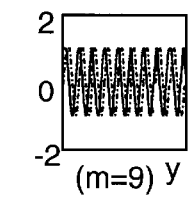
FIG. 13J (m=9) y
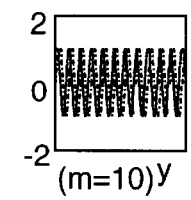
FIG. 13K (m=10) y
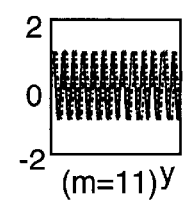
FIG. 13L (m=11) y
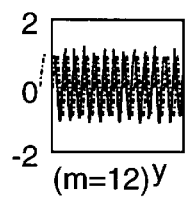
FIG. 13M (m=12) y
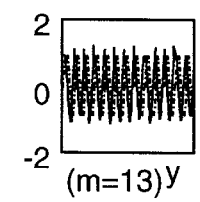
FIG. 13N (m=13) y
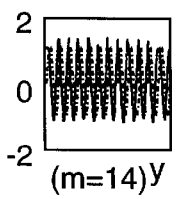
FIG. 13O (m=14) y
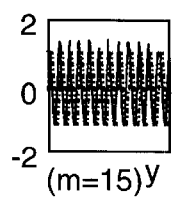
FIG. 13P (m=15) y
DEMODULATION
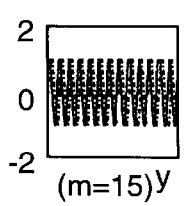
FIG. 15A (m=15) y

DEMODU-
LATION

METHOD FOR PARALLEL SPATIAL ENCODED MRI AND APPARATUS, SYSTEMS AND OTHER METHODS RELATED THERETO

This application claims the benefit of U.S. Provisional Application Serial No. 60/169,029 filed Dec. 3, 1999, the teachings of which are incorporated herein by reference.

STATEMENT REGARDING FEDERALLY-SPONSORED RESEARCH

This invention was supported by funding of the National Institute of Health. The United States Government has certain rights to the invention.

FIELD OF INVENTION

The present invention generally relates to apparatus and methods for magnetic resonance imaging (MRI), also known as nuclear magnetic resonance imaging (NMRI). More particularly the present invention relates to methods and apparatus for decreasing magnetic resonance data acquisition times including time for reconstructing the image wherein the data is acquired and the image is reconstructed in parallel. The present invention also relates to other methods and MRI systems and apparatus related thereto.

BACKGROUND OF THE INVENTION

Magnetic resonance imaging (MRI) is a technique that is capable of providing three-dimensional imaging of an object. A conventional MRI system typically includes a main or primary magnet(s) that provides the background magnetic field $B_o$, gradient coils and radio frequency (RF) coils, which are used for spatial encoding, exciting and detecting the nuclei for imaging. Typically, the main or primary magnet(s) are designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,968,937 and 5,990,681, the teachings of which are incorporated herein by reference, some exemplary MRI systems.

In MRI, the uniform magnetic field B. generated by the main or primary magnet(s) is applied to an imaged object by convention along the z-axis of a Cartesian coordinate system, the origin of which is within the imaged object. The uniform magnetic field $B_o$ being applied has the effect of aligning the nuclear spins, a quantum mechanical property of macroscopic particles comprising the imaged object, along the z-axis. In response to RF pulses of the proper frequency, that are orientated within the XY plane, the nuclei resonate at their Larmor frequencies. In a typical imaging sequence, the RF signal centered about the desired Lamor frequency is applied to the imaged object at the same time a magnetic field gradient $G_z$ is being applied along the z-axis. This gradient field $G_z$ causes only the nuclei in a slice with a limited width through the object along the XY plane, to have the resonant frequency and to be excited into resonance.

After excitation of the nuclei in the slice, magnetic field gradients are applied along the x-axis and y-axis respectively. The gradient $G_x$ along the x-axis causes the nuclei to precess at different frequencies depending on their position along the x-axis, that is, $G_x$ spatially encodes the precessing nuclei by frequency (i.e., frequency encoding). The y-axis gradient $G_y$ is incremented through a series of values and encodes the Y position into the rate of change of the phase of the precessing nuclei as a function of gradient amplitude, a process typically referred to as phase encoding.

The quality of the image produced by the MRI techniques is dependent, in part, upon the strength of the magnetic resonance (MR) signal received from the precessing nuclei. For this reason an independent RF coil is placed in close proximity to the region of interest of the imaged object in order to improve the strength of the received signal. Such RF coils are sometimes referred to as local coils or surface coils.

There is described in U.S. Pat. No. 4,825,162 a surface coil(s) for use in MRI/NMRI imaging and methods related thereto. In the preferred embodiment of that invention, each surface coil is connected to the input of an associated one of a like plurality of low-input-impedance preamplifiers, which minimizes the interaction between any surface coil and any other surface coils not immediately adjacent thereto. These surface coils can have square, circular and the like geometries. This yields an array of a plurality of closely spaced surface coils, each positioned so as to have substantially no interaction with all adjacent surface coils. A different MR response signal is received at each different one of the surface coils from an associated portion of the sample enclosed within the imaging volume defined by the array. Each different MR response signal is used to construct a different one of a like plurality of different images then being combined, on a point-by-point, basis to produce a single composite MR image of a total sample portion from which MR response signal distribution was received by any of the array of surface coils.

In the case of MRI phased-array coils, coils are de-coupled by two mechanisms; any adjacent pair of coils are de-coupled by overlapping and non-adjacent coils are de-coupled by combination of matching circuits and low impedance pre-amplifiers. The use of a phased array RF coils or surface coils with a tuned and matched circuit including low impedance pre-amplifiers have been used for de-coupling as well as a mechanism for improving the signal-to-noise ratio (SNR) and field of view (FOV). In this regard, it should be understood that the term "coupling" refers to the coupling of an MR signal in one coil to an adjacent coil such that the signal being outputted by the adjacent coil is a combination of the MR signal detected by the adjacent coil and the coupled MR signal. Consequently, the image from the adjacent coil would be distorted to some degree. Although the tuned and matched circuit including low impedance pre-amplifiers has been effective from the standpoint of improving SNR and FOV, such circuitry becomes ineffective when both the number of coils and the coil density is increased. In other words, as the spacing between adjacent coils and between adjacent portions of a coil is decreased signal coupling is increased irrespective of the tuned and matched circuits.

Although there are a variety of spatial encoding methodologies or techniques being implemented, the most popular method used in commercial MRI scanners is two dimensional Fourier transform (2DFT) encoding in which a two-dimensional spatial plane (e.g., XY plane) is encoded with both frequency and phase of the MR signals. Typically during one data acquisition, only a one dimensional time-domain signal is obtained and thus 2DFT encoding requires repeating the data acquisitions sequentially to achieve a pseudo second dimension of the time domain signals. The second dimension of the spatial information is encoded into the phase component by repeating the data acquisition with different phase encoding gradient strengths (i.e., varying $G_y$ to create the other pseudo-time dimension. In this technique, each slice of the imaged object is in effect divided into a multiplicity of layers in the y-direction or axis corresponding to the number of pixels in that direction (e.g., 128, 256). The number of pixels in turn is representative of the desired image resolution, in other words the higher the resolution the higher the number of pixels. In addition, the x- direction scanning process or the data acquisition is repeated by sequentially and repeatedly stepping through each of these y-direction layers. Because the resolution of the time-domain signals depends on the number of repetitions of the data acquisitions, and the repetition rate is limited by the MR relaxation times; a higher resolution image takes a longer time.

MR imaging has proven to be a valuable clinical diagnostic tool in a wide range of organ systems and patho-physiologic processes. Both anatomical and functional information can be gleamed from the MR data, and new applications continue to develop with each improvement in basic imaging technique and technology. For example, the ability to image and evaluate increasingly finer anatomical details have resulted with technological advances yielding improved achievable spatial resolution. Also, the technological advances allowing for fast imaging sequences has resulted in reduced imaging times such that many moving structures can be visualized without significant motion artifacts.

Often, however, there is tradeoff between spatial resolution and imaging time because higher resolution images require a longer imaging time. This balance between spatial and temporal resolution is particularly important in cardiac MR, where fine details of coronary artery anatomy must be discerned on the surface of a rapidly beating heart. Thus, a high-resolution image acquired over a large fraction of the cardiac cycle, will be blurred and distorted by the motion of the beating heart.

One technique for decreasing imaging time has concentrated on increasing speed of sequential scanning of K-space and thus acquisition of MR data by reducing the intervals between scanned lines. Because it has appeared difficult to significantly better efficiency of such conventional fast imaging, other fast imaging schemes have been proposed which schemes use simultaneous data acquisition in multiple RF coils. Such other schemes are described in detail in U.S. Pat. No. 5,910,728, the teachings of which are thus incorporated herein for such purpose.

Two recent methods, the Simultaneous Acquisition of Spatial Harmonics (SMASH) imaging in the time domain or k-space and the Sensitivity Encoded (SENSE) imaging in the frequency domain, changes such sequential data acquisition into a partially parallel process by using a phased array, thereby reducing the scan time as compared to the sequential data acquisition technique. In these two techniques, it is recognized that the data sampled below the Nyquist sampling rate can be recovered if the sensitivity profiles of the phased array detectors can provide enough spatial information to either interpolate the data in the time domain or unwrap the data in the frequency domain.

The time domain method or the SMASH method recognizes the equivalence between phase-encoding with MRI gradients and the composite spatial sensitivity inherent in the detectors. The SMASH method uses a numerical fitting routine to, among other things, interpolate a decimated number of phase-encoding steps and thus, achieve reductions in scan time. Although this numerical approach was instrumental in demonstrating the original SMASH concept, such a methodology ignores or does not recognize the underlying analytical relationship between the weighting factors for the composite harmonics, the image field-of-view (FOV), the spacing of the detectors, the harmonic orders, and the sensitivity profiles of the detector coils.

The SMASH method contains the following steps. First, sensitivity profiles of each of the phased array coil elements are derived from a separate data acquisition by MRI. Second, by using numerical fitting and computation, such as minimum least square or gradient-descent algorithms, the coefficients of linear combinations that compose the optimal sensitivity harmonics from the phased-array coils are numerically derived. Third, using composite harmonics to interpolate decimated phase encoding steps, the sampling rate is restored to the Nyquist frequency. Fourth, a Fast Fourier Transform (FFT) of the composite harmonics gives the non-aliasing MR image. There is described in U.S. Pat. No. 5,910,728 a conventional implementation of the SMASH methodology that utilizes a numerical gradient-descent fitting routine to generate a set of spatial harmonics from the sensitivity profile of a multi-channel array of MRI detectors to achieve multi-fold reductions in the gradient phase-encoding steps.

Also, the recursive numerical fitting routine for harmonic generation must simultaneously accommodate phase errors introduced by the individual detectors in the array. The phase errors imparted by each detector arise from the difference in the phase of the transverse magnetization generated at a point in space, as it is detected by each of the coils in the array due to the detector coils different locations in space. These phase errors may cause serious problems for generating spatial harmonics if they are not dealt with properly. Phase errors introduced by fixed or time-dependent acquisition delays, flow or motion, etc, on the other hand, will be the same for each detector coil so that their effect on the generation of harmonics will be insignificant although they can be the cause of image artifacts. In the implementation of conventional phased-array MRI using the SMASH technique, the numerical fitting technique used to generate the harmonics also includes compensating for spatial phase errors.

As to the SENSE method, and like the SMASH method, the maximum aliasing fold that can be unwrapped is limited to the number of elements or detectors making up the phased array coils. The SENSE method also requires precise sensitivity maps of all the detector coils in the phased-array. Thus, the SENSE method needs a large amount of preparation before reconstruction. Also, another problem with this method is that in locations where the sensitivities of multiple coils cannot be distinguished from each other, the SENSE reconstruction will fail.

A problem with such parallel data acquisition and reconstruction techniques is that conventional MRI phased array coils are unable to deploy a large number of coils due to the limitations imposed by both their loop structure and the de-coupling requirements for the mutual induction between the elements. Because the number of coils in the conventional phased array corresponds to the maximum decimation factor for reducing the number of phase encoding steps, existing phased array designs significantly limit the potential for parallel spatial encoding using the SMASH technique.

It thus would be desirable to provide an improved technique, method or procedure for spatially encoded MRI using the sensitivity profiles of an array of detectors, including a method for correcting the phase errors of the signals arising from the different detectors. It also would be desirable to provide MRI apparatuses or systems embodying or utilizing such a technique or procedure so as to allow the efficient combination, processing and reconstruction of the acquired decimated parallel MRI data. In addition, it would be desirable to provide techniques, methods or procedures that could be extended for use with MRI systems or apparatuses that deploy large numbers of coils or detector elements. Further, it would be desirable to provide techniques, methods or procedures that are adaptable so as to simulate spatial harmonic generation and evaluate conditions that introduce error and distortion of composite signals as a mechanism, for example, to maximize the number of useable harmonics for image reconstruction. As compared to the prior art techniques, apparatuses, and systems utilizing a numerical fitting procedure, the improved technique or the apparatuses or systems embodying such a technique would be analytical.

DEFINITIONS

The instant invention is most clearly understood with reference to the following definitions or the terms used in equations unless otherwise separately defined.

w(x, y) represents the spin density distribution weighted by the relaxation times T1 and T2.

f(x, y) is the sensitivity profile of each individual detector.

φ(x, y) represents the phase error introduced by each detector.

$C(k_y, n)$ forms a set of weighting coefficients

γ is the gyromagnetic ratio

SUMMARY OF THE INVENTION

The present invention features an analytical methodology for spatially encoded MRI using the sensitivity profiles of an array of detectors, including a methodology for correcting the phase errors of the signals from the different detectors comprising the array. As compared to prior art techniques such an analytical methodology advantageously yields an analytical transform providing inter alia a quantitative relationship between the weighting coefficients of the composite signals, the detector geometry, the sensitivity profile, the image field-of-view (FOV). Also, such an analytical methodology advantageously yields harmonic order and the detector index. Additionally, and as compared to prior art techniques, such an analytical methodology advantageously provides a mechanism for removing or dealing with space-related phase errors of the detectors and analytically restoring the phase coherence among the signals from the array of detectors. Further, such a method also advantageously avoids the potential burden and cost of using hardware to correlate the phases of the signals in multiple receivers or the prior art reconstruction technique of the root-of-the-sum-of-the-squares. Also featured are other methods or techniques related thereto as well as apparatuses or systems embodying any of a number of the herein described methods, procedures or processes according to the present invention.

According to one aspect of the present invention, there is more particularly featured a method for correcting spatially-related phase errors and restoring phase coherency among MR signals received substantially independently from a plurality of RF detectors forming a plurality of receive channels, the detectors being configured so as to form an array of detectors (i.e., a phased array of detectors). The method includes applying a Fourier transform to the independently received MR signals so as to convert each received MR signal of each receive channel from k-space to image domain and applying a Hilbert transform to the magnitude of each converted signal in the image domain to generate the signal's minimum phase. Such a method also includes applying an inverse Fourier transform to convert each signal with magnitude and minimum phase from the image domain back to k-space. In this way, the resultantly converted k-space signals are substantially free of spaced related errors.

According to another aspect of the present invention there is featured a method for parallel spatial encoding an MR image data that is frequency-encoded by MR gradient and sensitivity-encoded by the plurality of RF detectors of an RF detector array. The method includes applying an analytical transform function to generate weighting coefficients for a given spatial harmonic order and a given detector index. The numerator of the analytical transform is a complex exponential function having an exponent that is the product of 2π, the spatial harmonic order, the RF detector index, RF detector spacing and the reciprocal of the field-of-view. The denominator of the analytical transform is a Fourier transform of the sensitivity profile of the detector. The method also includes generating linear combinations of the MR image data that is frequency-encoded and sensitivity-encoded to generate a set of spatial harmonics that can encode spatial frequencies. The method further includes applying at least a one-dimensional Fourier transform to a k-space data set in which spatial frequency dimensions are fully encoded, thereby resulting in an MR image of an observed slice of an object being observed.

The method further comprises demodulating the modulation of high order harmonics being generated by said applying an analytical transform function. The step of demodulating includes applying another Fourier transform to composite spatial harmonics to determine frequency and amplitude of a modulation component and adding another component, having same frequency and amplitude but opposite phase as the modulation component, to the generated high order spatial harmonics. In this way, the modulations of the high order harmonics are substantially eliminated.

According to yet another aspect of the present invention there is featured a method for imaging with an apparatus having multi-coil arrays and various MRI pulse sequences whose phase-encoding gradient increment is increased b-fold, resulting in a b-fold reduction in the total number of phase-encoding steps. In this method, the decimated raw data from each channel of the detector array are saved for reconstruction. This method includes acquiring a reference image or a sub-set of image data to obtain the sensitivity profiles of the array coils and acquiring the partial gradient phase-encoded signals from the phased array coils for each slice of the object being observed. The phases of the signals from the phased array coils is synchronized. More specifically, the signals are synchronized using a Fourier-Transform-Hilbert Transform (FT-HT) phase correction process of the present invention. The method also includes generating the harmonics to replace the phase-encoding steps and combining the harmonics by interleaving them to form a set of fully encoded raw data. The method further includes applying a 2-dimensional (2D) Fourier Transform to the fully encoded raw data to reconstruct the image.

Other aspects and embodiments of the invention are discussed below.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

FIGS. 6A–D are individual decimated images of human legs from four receive channels;

FIG. 6E is an ASP reconstruction image derived from the image data of the images of FIGS. 6A–D;

FIGS. 7A–D are graphical views of the amplitude of the real and imaginary parts of the composite harmonics for the zero order through the third order harmonics when $\sigma/d=0.5$;

FIGS. 8A–D are graphical views of the trajectories of the composite harmonics of FIGS. 7A–D in the complex plane;

FIGS. 9A–D are graphical views of the amplitude of the real and imaginary parts of the composite harmonics for the zero order through the third order harmonics when $\sigma/d=2.0$;

FIGS. 10A–D are graphical views of the trajectories of the composite harmonics of FIGS. 9A–D in the complex plane;

FIGS. 13A–P are graphical views of the amplitude of the real and imaginary parts of the composite harmonics for the zero order through the fifteenth ($15^{th}$) order harmonics when $\sigma \approx d$;

FIG. 15A is a graphical view of the effect of demodulation on the amplitude of the real and imaginary parts of the composite harmonic for the $15^{th}$ order harmonic illustrated in FIG. 13P.

DESCRIPTION OF THE PREFERRED EMBODIMENT

Figure 1:
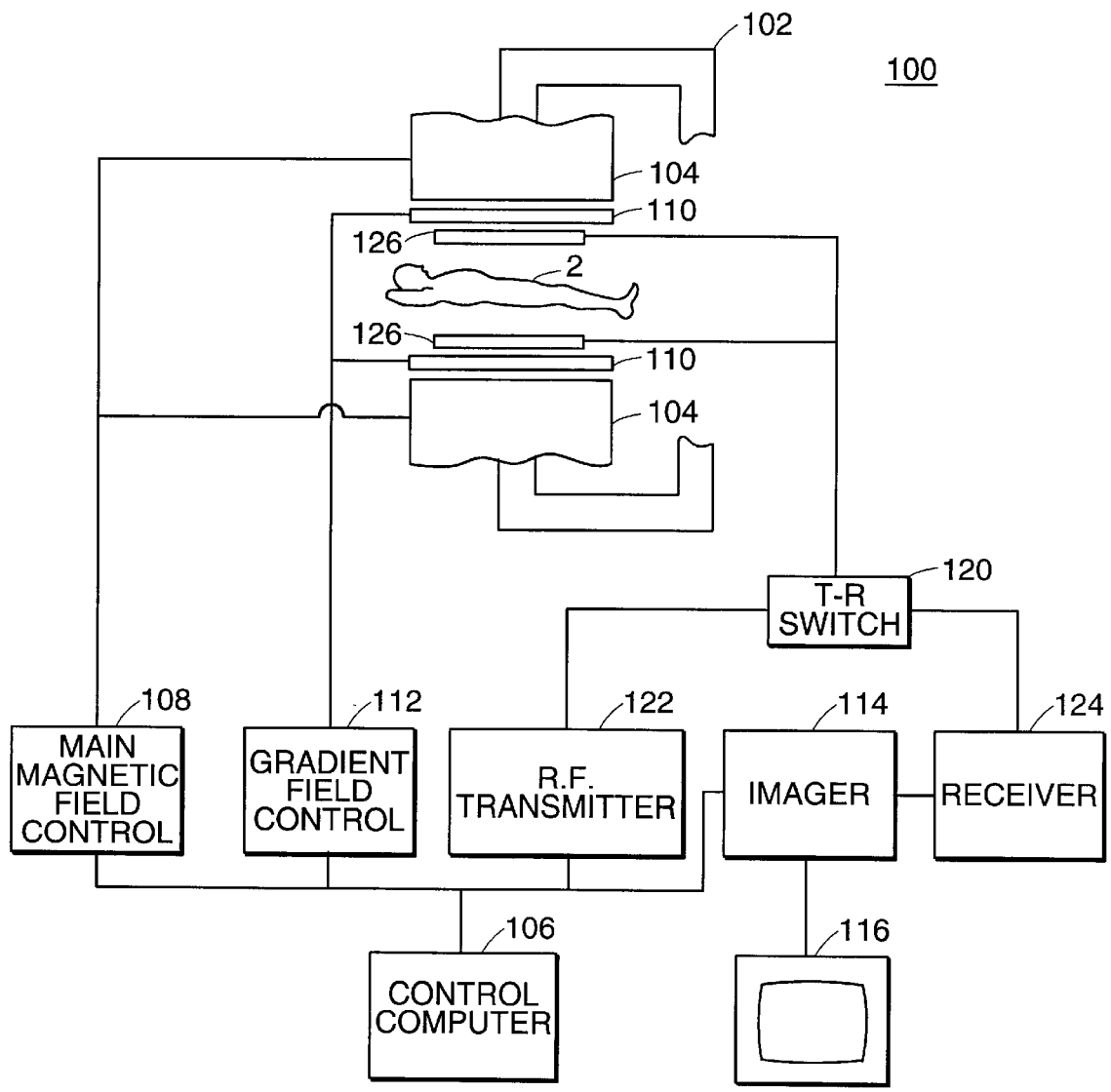
FIG. 1 is a schematic view of an exemplary magnetic resonance imaging (MRI) system adapted for use with the parallel encoding methodology according to the present invention.

Referring now to the various figures of the drawing wherein like reference characters refer to like parts, there is shown in FIG. 1 a schematic view of an exemplary magnetic resonance imaging (MRI) system 100 adapted for use with the parallel encoding methodology according to the present invention. Although a MRI system having a main magnet comprising a C-type magnet is illustrated, this shall not constitute a limitation as it is with the contemplated scope of the present invention to adapt any of a number of known MRI system to use the parallel encoding methodology according to the present invention. Reference also should be made to U.S. Pat. No. 4,968,937, the teachings of which are incorporated by reference for other details of the exemplary MRI system 100.

The MRI system 100 includes an electromagnet 102, a computer 106, a main magnetic field control 108, a gradient coil sub-system 110, a gradient field control 112, an imager 114, a display device 116, an RF antenna sub-system 126, a T/R switch 120, an RF transmitter 122 and a receiver 124. The electromagnet 102 produces a strong main magnetic field Bo across a gap between pole pieces 104 of the electromagnet. In use of the MRI system a body 2 or object to be imaged, for example a patient, is placed in the gap between the pole pieces 104 on a suitable support (not shown). The strength of the electromagnetic field in the gap between the pole pieces 104, and hence in the body 2, is controlled by the computer 106 via a main magnetic field control 108, which controls the supply of energizing current to the electromagnet energizing coil.

The gradient coil sub-system 110, having one or more gradient coils, is provided so a magnetic gradient can be imposed on the static magnetic field in the gap between the poles pieces 104 in any one or more of three orthogonal directions x, y, and z. The gradient coil sub-system 110 is energized by a gradient field control 112 that also is under the control of the computer 106.

The RF antenna sub-system 126 of a conventional parallel MRI data acquisition type of system typically includes a plurality or more of coils arranged to simultaneously detect the MR signals from the body 2. The RF antenna sub-system 126 is selectably interconnected to one of the RF transmitter 122 or the receiver 124 by the T-R switch. The RF transmitter 122 and/or the T-R switch 120 are under the control of the computer 106 so that RF field pulses or signals are generated by the RF transmitter 122 and selectively applied to the body 2 for excitation of magnetic resonance in the body by the RF antenna subsystem 126. While these RF excitation pulses are being applied to the body 2, the T/R switch 120 also is actuated so as to de-couple the receiver 124 from the RF antenna subsystem 126.

Following application of the RF excitation pulses, the T/R switch 120 is again actuated to de-couple the RF antenna sub-system 126 from the RF transmitter 122 and to couple the RF antenna sub-system to the receiver 124. The RF antenna sub-system 126 in this arrangement detects or senses the MR signals resulting from the excited nuclei in the body and passes the MR signals onto the receiver 124. These detected MR signals are in turn passed onto the imager 114. The imager 114, under the control of the computer 106, and implementing the parallel MR encoding methodology of the present invention, processes the MR signals to produce signals representative an image of the body 2. These processed signals representative of the image are sent onto a display device 116 to provide a visual display of the image.

In operation, the uniform magnetic field $B_o$ generated by the main or primary magnet(s) 102 is applied to the body 2 by convention along the z-axis of a Cartesian coordinate system, the origin of which is within the imaged object. The uniform magnetic field $B_o$ being applied has the effect of aligning the nuclear spins, a quantum mechanical property of macroscopic particles comprising the body 2, along the z-axis. In response to RF pulses of the proper frequency being generated by the RF transmitter 122, that are orientated within the XY plane, the nuclei resonate at their Larmor frequencies. In a typical imaging sequence, the RF signal centered about the desired Lamor frequency is applied to the body 2 at the same time a magnetic field gradient $G_z$ is being applied along the z-axis by means of the gradient control sub-system 110. This gradient field $G_z$ causes only the nuclei in a slice with a limited width through the body 2 along the XY plane, to have the resonant frequency and to be excited into resonance.

After excitation of the nuclei in the slice, magnetic field gradients are applied along the x and y axes respectively. The gradient $G_x$ along the x-axis causes the nuclei to precess at different frequencies depending on their position along the x-axis, that is, $G_x$ spatially encodes the precessing nuclei by frequency (i.e., frequency encoding). The y-axis gradient $G_y$ is incremented through a series of values and encodes the y position into the rate of change of the phase of the precessing nuclei as a function of gradient amplitude, a process typically referred to as phase encoding.

Using the parallel encoding techniques or methodologies of the present invention hereinafter described, the encoded position information is used to create the image of the portion of the body being scanned. Consequently, the time taken to create the complete image of the body 2 is significantly reduced as compared to MRI systems that embody serial encoding techniques or methodologies.

As more particularly described in the following, the Analytical SMASH Procedure (ASP) methodology of the present invention replaces the numerical fitting approach of the conventional SMASH procedure with a transform that generates a set of spatial harmonics corresponding to the image representation in k-space. This transform directly generates the complex weighting factors for the composite harmonics based on the FOV and the spacing of the detectors. The Fourier transform (FT) of the detector sensitivity profiles provides the proper scaling factors among the different orders of the generated harmonics. The images thus can be reconstructed using a standard 2-Dimensional (2D) Fourier transform technique.

The method further includes removing spatially-dependent phase errors introduced by the individual detectors making up the array from the raw data, more specifically by applying the Fourier transform and an Hilbert transform (HT) together. Consequently, not only are this type of phase errors removed, but the spatial encoding, including that phase information essential for complete image restoration, is preserved. As also provided hereinafter, the analytical transform of the present invention also can be used to simulate the SMASH method, and which yields a criterion for the ratio of the sensitivity profile width to the detector spacing that produces the maximum number of harmonics for a given number of detectors, and guidelines to deal with defective harmonics and high-order harmonic modulation.

Before discussing the development of the analytical transform, correcting for phase errors or the mathematics related to other method embodiments of the present invention, the discussion is first directed to theoretical aspects. Consider an array of N detectors lined up along the y-axis with spacing d. The k-space MRI signal from the $n^{th}$ detector for a selected slice is defined by the following relationship:

$$s_n(k_x, k_y) = \sum_x \sum_y w(x, y) e^{i(k_x x + k_y y)} f_n(x, y) e^{i\varphi_n(x,y)}, \quad [1]$$

where x and y are spatial coordinates.

The spatial encoding factor, $e^{i(k_x x + k_y y)}$, includes both frequency-encoding and phase-encoding. As to the frequency-encoding term, $e^{i k_x x}$, and with $k_x = \gamma G_x t$, the frequency encoding term becomes $e^{i \gamma G_x x t}$, where the frequency-encoding gradient is $G_x$ and the data acquisition time variable is t. As to the phase-encoding term, $e^{i k_y y}$, and with $k_y = \gamma g_y(mT)$, the frequency encoding term becomes $e^{i \gamma m g_y y T}$, where the phase-encoding gradient increment is $G_y = m g_y$, the phase-encoding step is m (m=0,1,2,..., M−1 and M is the total number of phase-encoding steps), and the phase encoding gradient period is T. Here (mT) in the $k_y$ expression is equivalent to a pseudo time variable which serves as the second time dimension in the 2D FT, and M is one of the factors that determine total scan time.

The $k_y$ expression however, can be viewed from another aspect, because $\gamma g_y T = 2\pi/Y$, where Y is the FOV in the y direction. Thus, the $k_y$ expression becomes $k_y = m(2\pi/Y)$. This indicates that $k_y$ is the spatial frequency, which can be encoded not only by phase-encoding gradients applied serially, but also by the composite spatial harmonics from sensitivity profiles of the detectors, in parallel.

The sensitivity profile f(x,y) of the detectors can be evaluated from the Biot-Savart law or other forms of Maxwell's equations, or by experimental measurements. As is also done in the original SMASH method, the x-dependency of the sensitivity profiles are ignored to simplify the analytical transform, such that f(x,y)=f(y). With this assumption, the sensitivity profile of the $n^{th}$ detector in Eq. [1] becomes f(fy−nd). When the FOV is large, and for real coils with a finite x-dimension, this assumption may introduce slight errors.

Now the discussion is directed to the development of an analytical transform between the phase-encoding, represented by the $e^{i k_y y}$, term in Eq. [1], and the sensitivity profile, represented by f(y−nd), such that a set of linear combinations of the latter can be used to replace a set of phase-encoding steps. A basic assumption of the SMASH method is that phase-encoding steps can be composed from a linear combination of the sensitivity profiles of the detectors in the array. This assumption can be written in the form:

$$e^{i k_y y} = \sum_{n=0}^{N-1} C(k_y, n) f(y - nd), \quad [2]$$

The Fourier transform of Eq. [2], yields the following transform that can be used to calculate $C(k_y, n)$:

$$C(k_y, n) = \frac{e^{i n d k_y}}{F(k_y)} \quad [3]$$

where $F(k_y)$ is the FT of f(y). As provided above, ky=m(2π/Y), thus Eq. [3] can be rewritten as $$C(m, n) = \frac{e^{i 2\pi mn(d/Y)}}{F(m)} \quad [4]$$

This equation again underscores the relationship between the weighting coefficient of composite harmonics, the FOV, the detector spacing, and the harmonic order for the $n^{th}$ detector. The mathematical derivation of Eq. [3] and proof that it can be used for spatial encoding are presented in the Appendix A hereto. Although Eq. [3] is an explicit analytical expression of the weighting parameters of the linear combination in Eq. [2], the convergence of Eq. [2] is conditional, which can be attributed to the non-orthogonality of f(y−nd). This is discussed hereinafter in the discussion regarding Simulations.

In the case where N detectors are used to encode the whole image along the y-direction, once $C(k_y,n)$ is determined and assuming that phase errors are corrected, the composite k-space signal is, combining Eqs. [1] and [2]:

$$s(k_x, k_y) = \sum_{n=0}^{N-1} C(k_y, n) s_n(k_x) \qquad [5]$$

$$= \sum_x \sum_y w(x, y) e^{i\, k_x x} \sum_{n=0}^{N-1} C(k_y, n) f(y - nd)$$

$$= \sum_x \sum_y w(x, y) e^{i\, (k_x x + k_y y)},$$

Thus, the image signal is completely encoded in 2D k-space, just as if it were encoded using phase-encoding gradients. The image is reconstructed by 2D Fourier transform of Eq [5]:

$$S(x, y) = FT\{s(k_x, k_y)\} = \sum_x \sum_y w(x, y) \delta(x' - x) \delta(y' - y) \qquad [6]$$

Because of the present technical limits on detector design and availability, a practical way in which to implement the ASP methodology of the present invention is to combine partial gradient phase-encoding and partial ASP encoding, to achieve complete spatial encoding and a several-fold reduction in scan time. This is referred to hereinafter as a hybrid analytical SMASH procedure (HASP). The partial gradient phase-encoding is a decimation of the full phase encoding steps, with a down-sampling factor of $\beta<N$ (N being the number of detectors/coils in the array). The partial ASP encoding is to generate $\beta$ spatial harmonics with decimated phase encoding data from an array of detectors. In connection with this embodiment, $k_y^*$ is defined as the spatial frequency for the partial gradient phase-encoding, $k_y^{**}$ as the spatial frequency for the partial ASP encoding, and $k_y$ is the spatial frequency for the entire HASP.

The analytical transform provided in either of Eq. [3] or Eq. [4], is applied to the HASP process. In the case where the number of detectors is N=4, and the phase encoding is decimated by factor $\beta=2$, as illustration of such an HASP application, the zero and first harmonics are generated with the ASP methodology of the present invention. Therefore, and assuming that phase errors are corrected, the signals with decimated phase encoding are:

$$s_n(k_x, k_y^*) = \sum_x \sum_y w(x, y) e^{i\, (k_x x + 2k_y^* y)} f(y - nd) \qquad [7]$$

$n = 0, 1, 2, 3.$ where, n=0, 1, 2, 3, $k_y^* = m\,(2\pi/Y)$, with m=0, 1, ..., M/2−1. The two harmonics generated by the ASP methodology are formed from the phased-array signals:

$$ss_1(k_x, k_y^*) = \sum_{n=0}^{3} C(k_y^{}[m^{} = 0], n) s_n(k_x, k_y^*) \qquad [8]$$

$$ss_2(k_x, k_y^*) = \sum_{n=0}^{3} C(k_y^{}[m^{} = 1], n) s_n(k_x, k_y^*)$$

where $k_y^{**} = m\,(2\pi/Y)$. Substituting Eqs. [7] and [2] into Eq. [8] results in $$ss_1(k_x, k_y^*) = \sum_x \sum_y w(x, y) e^{i\, (k_x x + 2k_y^* y)} \qquad [9]$$

$$= \sum_x \sum_y w(x, y) e^{i\, \left(k_x x + 2m^*\left(\frac{2\pi}{Y}\right)y\right)}$$

$$ss_2(k_x, k_y^*) = \sum_x \sum_y w(x, y) e^{i\, (k_x x + 2k_y^* y)} e^{i\, \frac{2\pi}{Y} y}$$

$$= \sum_x \sum_y w(x, y) e^{i\, \left(k_x x + (2m^* + 1)\left(\frac{2\pi}{Y}\right)y\right)}$$

From the exponents it can be seen that $ss_1$, corresponds to the even orders of $k_y^*$, while $ss_2$ corresponds to the odd orders. Thus, by interleaving $ss_1$ and $ss_2$, Eq. [9] for the hybrid ASP method can be combined to yield:

$$s(k_x, k_y) = \sum_x \sum_y w(x, y) e^{i\, (k_x x + k_y y)} \qquad [10]$$

where $k_y = m\,(2\pi/Y)$, m=0,1, ..., 2m*, 2m*+1, ..., M−1. This is equivalent to both conventional gradient phase-encoded MRI or fully-encoded ASP as described in Eq [5]. This is readily extended to other detector array sizes (N) and decimation factors $\beta$, by generating and combining additional composite signals in Eqs. [8], [9] with weighting coefficients determined from Eq. [3].

The discussion now is directed to the development of another methodology or process for removing spatially-dependent phase errors introduced by the detectors or coils comprising a detector array more particularly such a process for removing such phase errors while preserving phase information essential for image reconstruction or restoration. More specifically, hereinafter described is a Fourier-Hilbert transform (FT-HT) method according to the present invention for phase correction that eliminates the phase distortion while retaining the spatial encoding information. It should be recognized that other mathematical techniques or procedures also can be used that can remove the spatially-dependent phase errors while retaining spatial encoding information. For example, the relative phase shift of the signals from all of the coils can be calculated for each point. Such phase shifts are due to the distances between each given point to the coils and would require the sensitivity profile of each coil.

The Fourier transform (FT) of the partial phase-encoded raw MR data can be written as:

$$FT\{s_n(k_x, k_y^*)\} = S_n(x, y^*) = |S_n(x, y^*)| e^{i(\phi_n^{min}(x, y^*) + \phi_n(x, y^*))} \qquad [11]$$

Here, with the FT, the spatial encoding information within the phase of the k-space signals $s_n(k_y, k_y^*)$ is completely mapped to the magnitude of the image domain signal $S_n(x, y^*)$. Therefore the magnitude of the image $|S_n(x,y^*)|$ contains both the image signal intensity weighting and the spatial encoding, while the phase of the image contains both the minimum phase $\phi_n^{min}(x, y^*)$ and phase error components, $\phi_n(x, y^*)$. With both the minimum phase and the magnitude, the image can be inverse Fourier transformed (IFT) back to k-space free of the phase errors. If the phase errors are removed simply by IFT of only the magnitude $|S_n(x, y^*)|$ however, additional distortions can be introduced in k-space despite being free of the original space related phase errors as well as causing some essential information (e.g., minimum phase) to be lost.

Figure 2A:
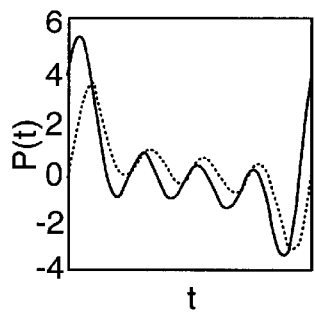
FIGS. 2A–F are various graphical views illustrating the difference between the FT of the minimum phase signal and the magnitude only signal
Figure 2C:
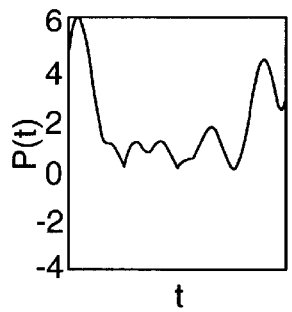
Figure 2E:
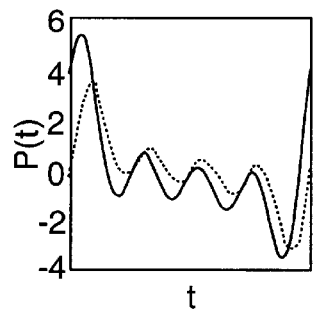
Figure 2B:
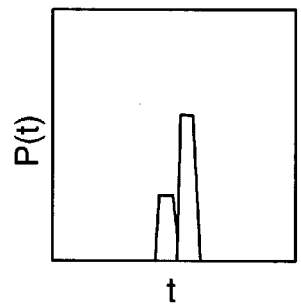
Figure 2D:
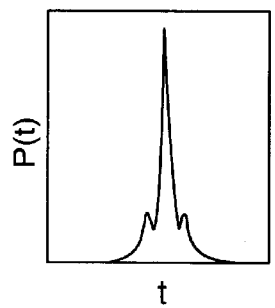
Figure 2F:
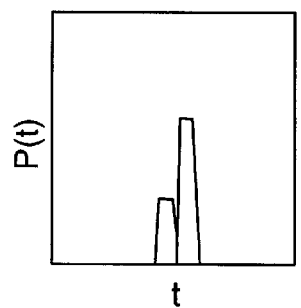

There is shown in FIGS. 2A–2F various views graphically illustrating the difference between the FT of the minimum phase signal and the magnitude only signal. FIG. 2A is an illustration of the original analytical signal, p(t), which is generated from the sum of four sinusoid functions and FIG. 2B is the Fourier transform of p(t), which is referred to as P(f) thereon. FIG. 2C is an illustration of the magnitude of the original analytical signal, |p(t)| and FIG. 2D is the Fourier transform of |p(t)|. FIG. 2E is an illustration of the minimum phase signal recovered from the magnitude |p(t)| via a Hilbert transform and FIG. 2F is the Fourier transform of the recovered signal. The horizontal axes of these figures are in time (t) or frequency (f) and the vertical axis are in arbitrary units.

Because the minimum phase $\phi_n^{min}(x, y^*)$ and the magnitude $|S_n(x,y^*)|$ are a Hilbert transform (HT) pair, one can apply a HT to $|Sn(x,y^*)|$ to create $\phi_n^{min}(x, y^*)$. The procedure to synchronize the phases of multiple channel signals can be summarized as $$s_n(k_x, k_y^*) \xrightarrow{FT} S_n(x, y^*),$$

$$|S_n(x, y^*)| \xrightarrow{HT} S_n^h(x, y^*) = |S_n(x, y^*)|e^{i\phi_n^{min}(x,y)},$$

$$S_n^h(x, y^*) \xrightarrow{IFT} s_n^h(k_x, k_y^*).$$

[12]

The k-space signal $s_n^h(k_x, k_y^*)$ contains all of the essential spatial-encoding information, but is free of the phase distortion. Thus, it can now be used to generate harmonics.

Figure 3:
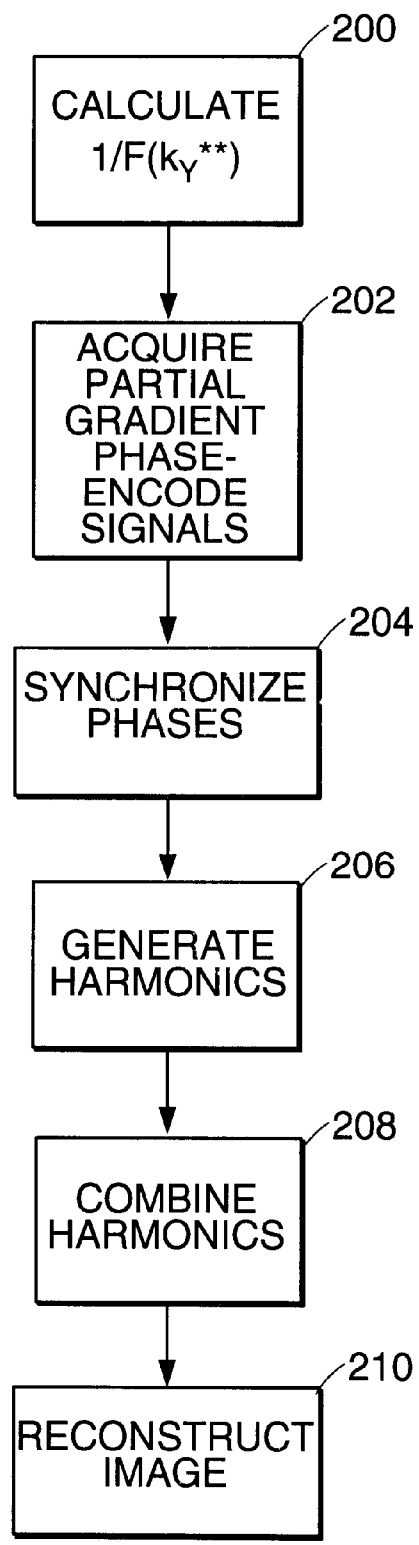
FIG. 3 is a high level flow diagram of an embodiment of the Analytical SMASH Procedure (ASP) according to the present invention.

There is shown in FIG. 3 a high level flow diagram of the ASP method or procedure according to the present invention for reconstructing an image from the raw MR data. Such a method can be implemented with multi-coil arrays and various Fourier MRI pulse sequences whose phase-encoding gradient increment is increased β-fold, resulting in a β-fold reduction in the total number of phase encoding steps. The decimated raw data from each channel of the detector array are saved for image reconstruction using the ASP methodology of the present invention.

First, a reference image or a sub-set of the image is acquired to obtain the sensitivity profile [f(y)] of the detectors making up the detector array such as the RF antenna sub-system 126 (FIG. 1). Using this information, the reciprocal of the Fourier transform of f(y), namely 1/ F(ky**) is calculated, STEP 200. The foregoing is accomplished using any of a number of techniques known to those skilled in that art. As is known in the art, and as described herein, the sensitivity profiles can be determined by acquiring a reference image or a sub-set of such image data using a phantom or other reference object. Such obtaining or acquiring of the sensitivity profiles can be conducted each time an object is to be scanned or at other times provided that the phantom or reference object has a reference load that is equivalent to the load of the object to be MR scanned.

Thereafter, the partial gradient phase-encoded signals from the phase-array coils comprising the RF antenna sub-system 126 are acquired, STEP 202. As indicated in the discussion above regarding FIG. 1, when MR signals are to be received from the object or body 2, the RF antenna sub-system 126 is interconnected to the receiver 124 so that the MR signals are received, processed an outputted by the receiver to the imager 114. When so connected the RF antenna sub-system 126 comprises the detector array.

The phases of the signals are synchronized so as to remove spatially-dependent phase errors introduced by the detectors or coils of the detector array, STEP 204. As more particularly described above, such synchronization is accomplished by performing the FT-HT process. More specifically, the FT-HT method as set forth in Eq. 12 is applied to a set of multi-channel MRI data for phase correction.

The method further includes generating the harmonics to replace the phase-encoding steps, STEP 206. In other words, the transforms of either or Eqs. 3, 4 or 8 are used to calculate a set of weighting parameters, based on the harmonic order, coil index, coil spacing, field-of-view and 1/ F(k_y**). Linear combinations of the signals from the multiple detectors are generated with the proper weighting parameters to form the zero order, first order, etc. harmonics. The harmonics are then combined by interleaving them to form a fully-encoded set of raw data, STEP 208 (e.g., Eq. 9). Thereafter, and in accordance with techniques known to those skilled in the art, a 2D Fourier transform is applied to the raw data to reconstruct the image, STEP 210.

Using this analytical methodology, the accuracy of the harmonics generated is determined primarily by three factors. The first, and in no particular order of importance, is the extent to which the phase errors are removed and the phases of the multiple channel signals synchronized via the FT-HT process. The second is the ratio of the width of the f(y) to the coil spacing, which is more particularly discussed hereinafter, although the optimal ratio is approximately unity. The third is the accuracy of determining the sensitivity profile of the coil and the calculation of 1/ F(k_y**).

Figure 4A:
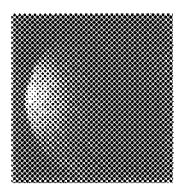
FIGS. 4A–4T are various views demonstrating harmonic generation and the effect of phase correction on data obtained from a phantom.
Figure 4B:
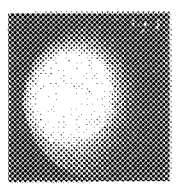
Figure 4C:
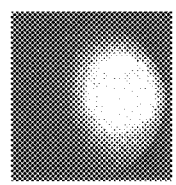
Figure 4D:
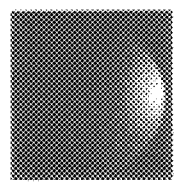
Figure 4E:
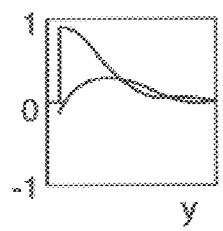
Figure 4F:
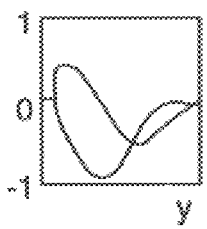
Figure 4G:
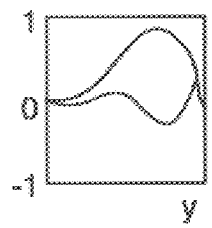
Figure 4H:
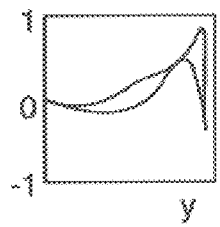
Figure 4I:
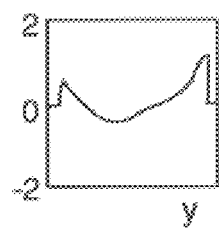
Figure 4J:
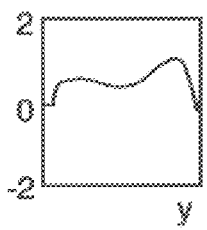
Figure 4K:
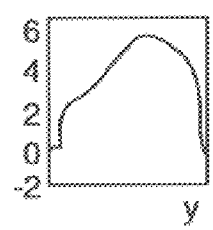
Figure 4L:
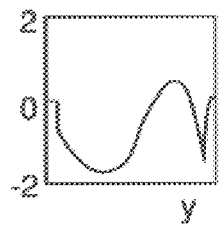
Figure 4M:
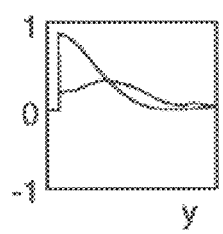
Figure 4N:
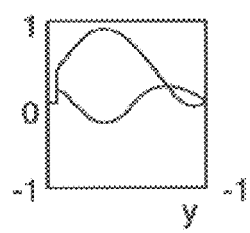
Figure 4O:
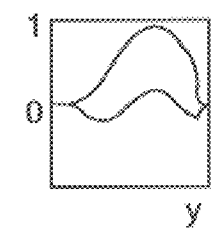
Figure 4P:
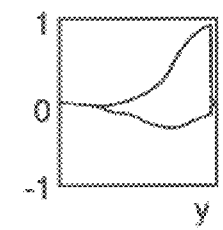
Figure 4Q:
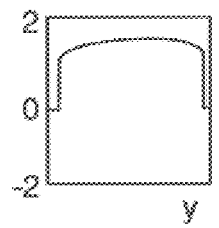
Figure 4R:
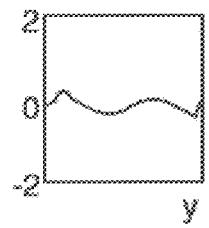
Figure 4S:
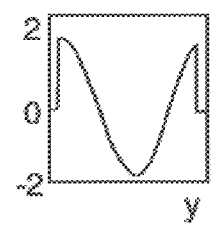
Figure 4T:
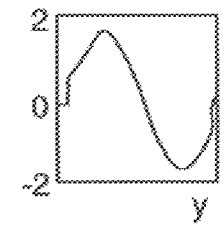

There is shown in FIGS. 4A–T various views demonstrating harmonic generation and the effect of phase correction in harmonic generation on the data obtained from a phantom. FIGS. 4A–D are images from the four coils, where the data of the horizontal lines in the images are used to demonstrate the harmonic generation and phase correction. FIGS. 4E–H are graphical illustrations of the real (Re) and Imaginary (Im) parts of the profiles through the horizontal lines on the images in FIGS. 4A–D respectively without phase correction. FIGS. 4I and 4J are graphical illustrations of the Re and Im parts of the zero order harmonic generated from FIGS. 4E–H and FIGS. 4K and 4L are graphical illustrations of the Re and Im parts of the first order harmonic generated from FIGS. 4E–H. As can be seen from FIGS. 4I–L, the composite harmonics exhibit distortions due to phase incoherence.

There is graphically illustrated in FIGS. 4M–P the Re and Im parts of the horizontal lines after phase correction using the FT–HT process. FIGS. 4Q and 4R are graphical illustrations of the Re and Im parts of the zero order harmonic generated from FIGS. 4M–P and FIGS. 4S and 4T are graphical illustrations of the Re and Im parts of the first order harmonic generated from FIGS. 4M–P. For the non-image figures the vertical axis is in arbitrary units.

Figure 5A:
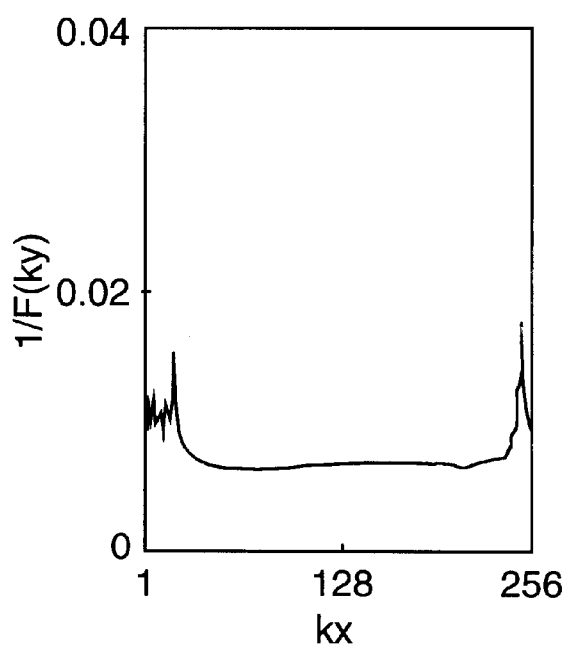
FIGS. 5A, B are graphical views illustrating the dependency of $1/F(k_y^{})$ on $k_x$ for $m^{}=0$ (5A) and $m^{**}=1$ (5B)
Figure 5B:
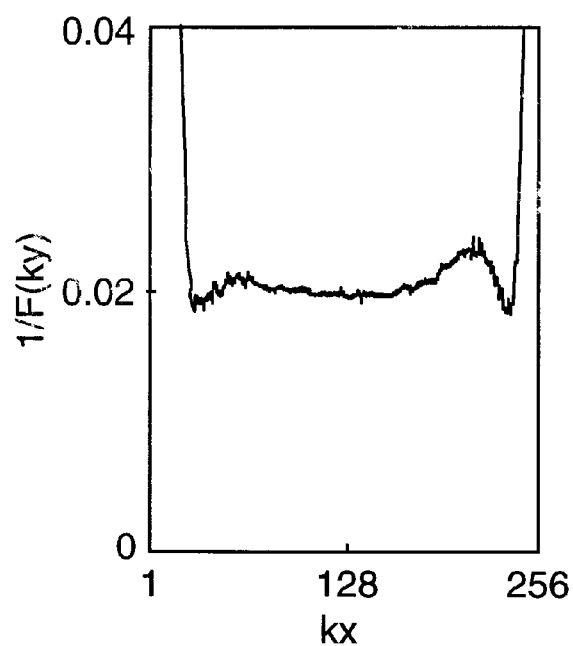
Figures 11A, 11B, 11C, 11D:
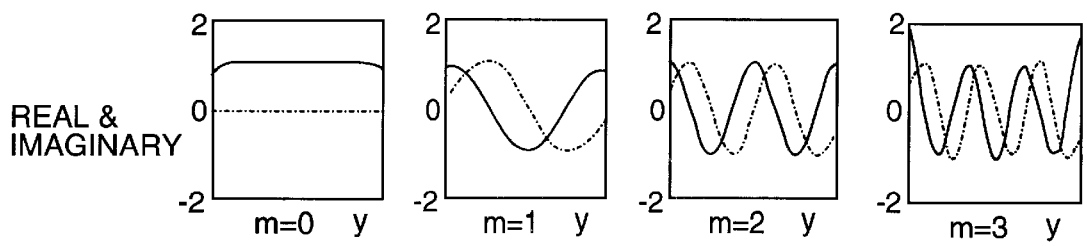
FIGS. 11A–D are graphical views of the amplitude of the real and imaginary parts of the composite harmonics for the zero order through the third order harmonics when $\sigma/d=1.0$.

In contrast to the conventional SMASH method, which uses the sensitivity profile f(y-nd) to iteratively derive the weighting parameters of the composite harmonics, the ASP method of the present invention requires only F(k_y) the FT of f(y), as the scaling factors among the generated harmonics. The HASP method only need partial knowledge of F(k_y), which is F(k_y), where k_y=m(2π/FOV) for m=0, 1, . . . , β–1, to determine the weighting coefficients C(k_y,n) from Eq. [3] or [4]. As also noted above, when the dimensions of the detector coils in the x-direction are comparable to the extent of the object be imaged, the assumption that 1/F(k_y) is independent of k. may require modification to avoid artifacts. In this regard, there is graphically illustrated in FIG. 5A,B the dependency of $1/F(k_y^{})$ on k. for a phantom comprising a 28 cm diameter circular phantom, where FIG. 5A is $m^{}=0$ and FIG. 5B is for $m^{}=1$. The figures illustrate that $1/F(k_y^{**})$ is constant across the major part of the sample and requires some adjustment only near the edges.

In Vivo

Using a GE Medical System (Milwaukee Wis.) Signa 1.5T scanner and a standard GE co-linear four-coil spinal phased-array having a spacing d of 10 cm, for detection, MRI data was acquired for an in vivo MRI of human legs. Further the width of the sensitivity profile, determined from MRI studies of a phantom was a $\sigma \approx 2.4d$. Although this commercial phased-array does not provide optimal geometry to maximize the available harmonics as discussed herein, it is nevertheless capable of generating two or three harmonics that can be used for spatial encoding. A gradient echo pulse sequence was modified to decimate the phase-encoding steps with $\beta=2$, reducing the total scan time by about half. The raw MR data from each of the four receiver channels were separately saved for reconstruction.

The in vivo image of the human legs was acquired with SPGR pulse sequence in which the phase encoding steps was decimated by factor of two. The decimated raw data were reconstructed by the ASP method without any numerical fitting. The decimated images from four receive channels are shown in FIGS. 6A–D and the image with ASP method reconstruction is shown in FIG. 6E. The individual images shown in FIGS. 6A–D and acquired with decimated phase-encoding steps clearly show an alias artifact due to decimation. However, the image shown in FIG. 6E, that is derived from these four aliasing images by ASP method reconstruction, exhibits proper spatial encoding.

Simulations

In addition to using the ASP methodology for reconstructing images from MR data, the analytical transforms comprising ASP can be used to simulate spatial harmonic generation and evaluate conditions that introduce errors and distortion of the composite signals. Such information can be used, for example, to develop optimal configurations or geometries for performing MRI scans that will maximize the number of useable harmonics for image reconstruction. In addition to discussion such simulation, the following also provides a further discussion, as indicated above, concerning optimal geometry and for handling image reconstruction cases in which such geometry is not optimal, particularly, when there would be a high order of harmonics (e.g. 31, 64 or 128 or higher order of harmonics).

For purposes of discussion, it is assumed that f(y) in Eq. [2] is a Gaussian function with width $\sigma$ equal to $\sqrt{2}$ of the Gaussian variance. The generated harmonics are complex functions, which, if perfect, follow a perfectly circular trajectory when plotted in the complex plane. Harmonic distortions also are manifested in the complex plane as deviations from the circular trajectories. It should be noted that the validity of the ASP for spatial encoding, presented in Appendix A, is not dependent on the precise form of f(y), so that many other distributions are useable as well.

In the following discussion, there is derived a criterion for the optimal detector geometry that provides the maximum number of useable harmonics for a given number of detectors. As to this derivation, the analysis proceeds on the assumption that the number of detectors in the array is nine (9). In such a case, the theoretical maximum number of harmonics is seven (7).

Mathematically projecting a harmonic onto a set of sensitivity profiles $f(y-nd)$ is not always valid. As noted above, one factor relating to the accuracy of ASP is the ratio of the width "$\sigma$" of the sensitivity profile f(y) to the detector spacing. There is shown graphically in FIGS. 7A–D the amplitude of the real (solid line) and imaginary parts (dashed line) of the composite harmonics for the zero order through the third order harmonics when $\sigma/d=0.5$, where the vertical axis is in arbitrary units. Correspondingly there is shown graphically in FIGS. 8A–D the trajectories of the composite harmonics of FIGS. 7A–D in the complex plane. From these figures it can be seen that when the ratio $\sigma/d$ is small, the harmonics are no longer smooth. Based 5 on the trajectories in the complex plane, this type of distortion is herein referred to as concave distortion.

Similarly, there is shown graphically in FIGS. 9A–D the amplitude of the real (solid line) and imaginary parts (dashed line) of the composite harmonics for the zero order through the third order harmonics when $\sigma/d=2.0$, where the vertical axis is in arbitrary units. Correspondingly there is shown graphically in FIGS. 10A–D the trajectories of the composite harmonics of FIGS. 9A–D in the complex plane. From these figures it can be seen that when the ratio $\sigma/d$ is large, the high order harmonics are lost (i.e., $m=3$ and above) and the encoding resolution is compromised. This type of distortion is herein referred to as concave distortion.

There are two cases where the harmonics are found to be optimal. One case is an unrealistic case where $\sigma \approx 0$, whereupon $f(y)=\delta(y)$, the composite signal becomes discrete, and the concave distortion disappears. In addition, because $F(k_y)=1$, there also is no convex distortion.

Figures 12A, 12B, 12C, 12D:
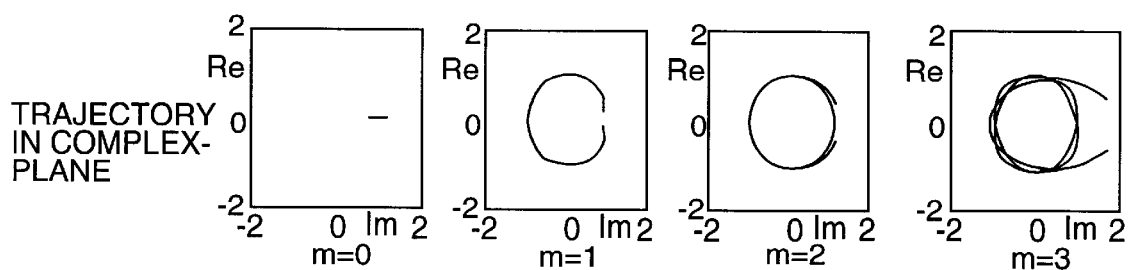
FIGS. 12A–D are graphical views of the trajectories of the composite harmonics of FIGS. 11A–D in the complex plane.

The other case is when $\sigma \approx d$, which is achievable with conventional detector 20 arrays. There is shown graphically in FIGS. 11A–D the amplitude of the real (solid line) and imaginary parts (dashed line) of the composite harmonics for the zero order through the third order harmonics when $\sigma/d=1.0$, where the vertical axis is in arbitrary units. Correspondingly there is shown graphically in FIGS. 12A–D the trajectories of the composite harmonics of FIGS. 11A–D in the complex plane. In this case, both concave and convex distortions are controlled sufficiently to avoid spoiling of both harmonic shape and resolution. Consequently, the criterion $\sigma \approx d$ yields the maximum number of harmonics that can be usefully obtained for ASP image encoding, for a given number of detectors N with Gaussian-shaped field profiles. Even with $\sigma \approx d$, it is shown in FIG. 12D that the highest order harmonic, $m=\pm 3$, manifests some ellipticity. Such modulation of the trajectories, not a convex distortion, is discussed below.

Failure to meet the criterion $\sigma \approx d$ does not mean that useful harmonics cannot be created, rather some of the harmonics derived with non-optimal detector geometry, hereinafter referred to as "quasi-harmonics", can be restored and used for spatial encoding. The diameter and spacing of phased-array coils currently in use is based on signal to noise ratio (SNR) considerations and minimizing decoupling, which means that $\sigma > d$ in most cases. Therefore some convex distortion is perhaps inevitable when ASP encoding with such coils.

Referring back to FIGS. 9A–d and FIGS. 10A–D, the simulations reveal three regimes when operating under these conditions. The first regime is where the harmonic order is low such as when $m=0, 1$ as shown in FIGS. 10A, where the composite signals have reasonable harmonic fidelity. The second regime is where the harmonic order is intermediate such as when $m=2$ as shown in FIG. 10C. In the second regime, the composite signals retain their order, but exhibit distortion involving enlargement of both end lobes. The third regime is where the order is high such as when $m=3$ as shown in FIG. 10D, so that the harmonic is completely lost from the composite signal, and cannot be created from the sensitivity profiles of the array. When N is large, the convex distortions can become very colorful, but still fall into these three regimes. Thus, increasing σ/d reduces the number of useable harmonics (i.e., regime one) and increases the number of unuseable harmonics (i.e., regime three).

The distorted composite signals in the second regime are those referred to above as being "quasi-harmonics", namely those harmonics that can be restored and used for spatial encoding. Knowing their envelopes, the quasi-harmonics can be scaled and restored to pure harmonics using any of a number of techniques known to those skilled in the art, such as convolving the k-space quasi-harmonics with a Fourier transform of the inverse of the envelope of the quasi-harmonics, thereby effectively increasing the number of useful harmonics that can be generated. As provided above, for 9 detectors and when σ≈d, the maximum theoretical number of useable harmonics that can be obtained is seven, however, only three harmonics are available when σ=2d. When the quasi-harmonics are restored, however, the maximum number of available harmonics becomes five (5). In sum, the recovering of harmonics from the quasi-harmonics effectively increases ASP image resolution when the optimal geometry criterion is not satisfied.

As indicated in the discussion above regarding FIG. 12D, the highest order harmonic, m±3, manifests some ellipticity. Although experimentally challenging, simulations can investigate the performance of ASP for very large numbers of detectors, potentially revealing characteristics at high harmonic orders that are yet to be seen in experiments. As such a simulation was performed assuming a detector array having 33 detectors or detector elements, where the theoretical maximum number of harmonics that can be generated is thirty-one (31). As explained below, a harmonic modulation phenomenon is identified for large m.

Figure 14A:
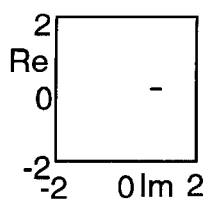
FIGS. 14A–P are graphical views of the trajectories of the composite harmonics of FIGS. 13A–P in the complex plane.
Figure 14B:
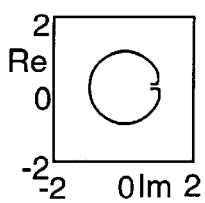
Figure 14C:
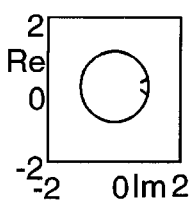
Figure 14D:
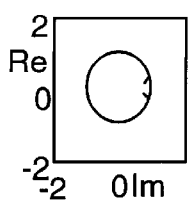
Figure 14E:
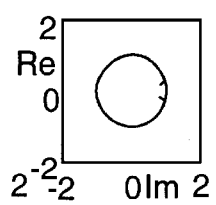
Figure 14F:
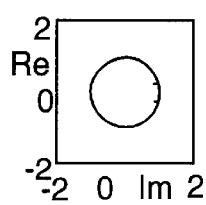
Figure 14G:
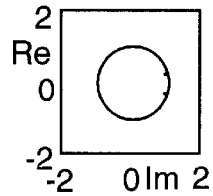
Figure 14H:
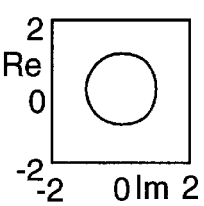
Figure 14I:
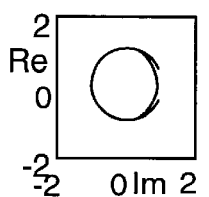
Figure 14J:
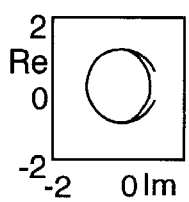
Figure 14K:
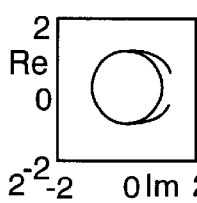
Figure 14L:
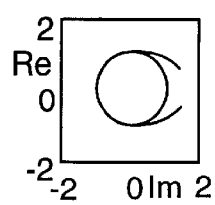
Figure 14M:
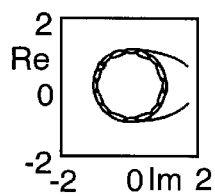
Figure 14N:
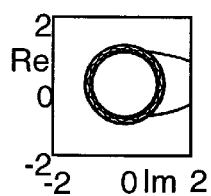
Figure 14O:
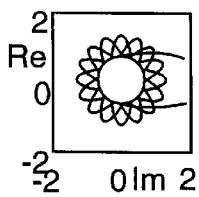

There is shown graphically in FIGS. 13A–P the amplitude of the real (solid line) and imaginary parts (dashed line) of the composite harmonics for the zero order through the fifteenth ($15^{th}$) order harmonics when σ≈d, where the vertical axis is in arbitrary units. Correspondingly there is shown graphically in FIGS. 14A–P the trajectories of the composite harmonics of FIGS. 13A–P in the complex plane. For brevity, only the m>0 harmonics are displayed in the figures; the m<0 harmonics are the same except for a π phase shift. Analysis of the frequency response of the high order harmonics by Fourier Transform reveals the presence of another frequency component, offset by Δ from each harmonic frequency. This component is most obvious in the complex plots of the highest harmonics (i.e., m=12 to 15), suggesting that the harmonics in Eq. [2] contain an additional component whose amplitude, $a_m$, increases with harmonic order:

$$e^{i\ k_y y} + a_m e^{-i\ (k_y + \Delta)y} = \sum_{n=0}^{N-1} C(k_y, n) f(y - nd) \quad [13]$$

Because $a_m$ and Δ can be accurately determined by Fourier Transform of the harmonics (e.g., frequency analysis), the composite signal can be demodulated by rearranging Eq. [13].

$$e^{i\ k_y y} = \sum_{n=0}^{N-1} C(k_y, n) f(y - nd) - a_m e^{-i\ (k_y + \Delta)y} \quad [14]$$

Figure 14P:
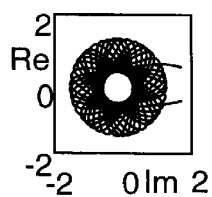
Figure 15B:
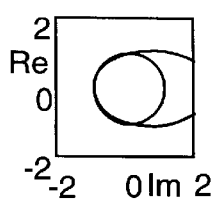
FIG. 15B is a graphical view of the effect of demodulation on the trajectory of the composite harmonic for the $15^{th}$ order harmonic illustrated in FIG. 14P

There is shown graphically in FIGS. 15A–B the effect of such demodulation on the amplitude of the real and imaginary parts of the composite harmonic for the $15^{th}$ order harmonic illustrated in FIG. 13P and on the trajectory of the composite harmonic for the $15^{th}$ order harmonic illustrated in FIG. 14P. The demodulation process of the present invention thus provides a mechanism so the ASP methodology is suitably useable when there are large number of detectors or detector elements in an array.

In sum, the present invention advantageously provides a complete analytical procedure for spatially encoded MRI using the sensitivity profiles of an array of detectors, including a method for correcting the spatial phase errors of the signals arising from the different detectors. In comparison to the original numerical SMASH methodology, the ASP methodology of the present invention includes an analytical transform that provides a quantitative relationship between the weighting coefficients of the composite signals, the detector geometry (spacing d), the sensitivity profile (1/F ($k_y$)), the image FOV, the harmonic order (m), and the detector index (a). This relationship establishes a theoretical foundation for parallel data acquisition and encoding with multiple detectors in MRI, and provides an efficient means of combining, processing and reconstructing the parallel MRI data.

In addition, the ASP methodology of the present invention provides a powerful tool to simulate harmonic generation by the method of spatial encoding with arrays of MRI detectors. Such simulation can reveal important insights about the properties of the method, thereby advancing its understanding, and facilitating its optimization for practical implementation in the clinic. In particular the criterion derived herein for optimal detector geometry provides a new target for detector design that may enhance the performance of the ASP. The FT-HT method, which removes the space-related phase errors and analytically restores the phase coherence among the signals from the array of detectors, relieves the potential burden and cost of using hardware to correlate the phases of the signals in multiple receivers, which has thus far been avoided in conventional phased-array MRI by using a root-of-the-sum-of-the-squares reconstruction. Finally, the simulations clearly demonstrate the potential of ASP for use with large numbers of detectors, paving the road for true parallel MRI and the achievement of manifold reductions in minimum MRI scan-time for fluoroscopy and other rapid dynamic studies that require high time resolution.

Although a preferred embodiment of the invention has been described using specific terms, such description is for illustrative purposes only, and it is to be understood that changes and variations may be made without departing from the spirit or scope of the following claims.

What is claimed is:

1. An imaging method for magnetic resonance imaging with an magnetic resonance imaging (MRI) apparatus having a multi-detector phased array and various MRI pulse sequences whose phase-encoding gradient increment is increased b-fold, resulting in a b-fold reduction in the total number of phase-encoding steps, wherein the decimated raw data from each channel of the detector phased array are saved for reconstruction; said imaging method comprising the steps of acquiring one of a reference image or a sub-set of image data to obtain sensitivity profiles of the array detectors;

acquiring the partial gradient phase-encoded signals from the phased array detectors for each slice of the object being observed;

synchronizing phases of the signals from the phased detector array;

generating harmonics to replace the phase-encoding steps;

combining the harmonics by interleaving them to form a set of fully encoded data; and applying a Fourier Transform to the fully encoded data to reconstruct the image.

2. The imaging method of claim 1 wherein said synchronizing includes synchronizing the phases of the signals from the phased detector array using a Fourier-Transform-Hilbert Transform (FT-HT) phase correction process.

3. The imaging method of claim 2, wherein said Fourier-Transform-Hilbert Transform (FT-HT) phase correction process includes;

applying a Fourier transform to the decimated raw data so as to convert the decimated raw data of each receive channel from k-space to image domain;

applying a Hilbert transform to the magnitude of each converted the decimated raw data in the image domain to generate a minimum phase; and applying an inverse Fourier transform to convert the decimated raw data with magnitude and minimum phase from the image domain back to k-space.

4. The imaging method of claim 1, wherein said applying a Fourier Transform comprises applying a 2-dimensional (2D) Fourier Transform to the fully encoded raw data to reconstruct the image.

5. The imaging method of claim 1, wherein said generating includes;

applying an analytical transform function to generate weighting coefficients for a given spatial harmonic order and a given detector index; and generating linear combinations of image data that is frequency-encoded and sensitivity-encoded to generate a set of spatial harmonics that can encode spatial frequencies.

6. The imaging method of claim 5, wherein the analytical transform being applied comprises:

a numerator that is a complex exponential function having an exponent that is the product of $2\pi$, spatial harmonic order, RF detector index, RF detector spacing and reciprocal of the field-of view; and a denominator that is a Fourier transform of the sensitivity profile of the detector.

7. The imaging method of claim 5, wherein, in the case where high order spatial harmonics are generated, said generating further comprises demodulating a modulation of the high order spatial harmonics.

8. The imaging method of claim 7, wherein said demodulating includes:

applying a Fourier transform to composite spatial harmonics to determine a frequency and amplitude of a modulation component; and adding a compensation component to the generated high order spatial harmonics, where said compensation component has a same frequency and amplitude but opposite phase as with the modulation component.

9. A method for correcting spatially-related phase errors and restoring phase coherency among MR signals received substantially independently from a plurality of RF detectors forming a plurality of receive channels, the detectors being configured so as to form an array of detectors, said method comprising the steps of:

applying a Fourier transform to the independently received MR signals so as to convert each received MR signal of each receive channel from k-space to image domain;

applying a Hilbert transform to the magnitude of each converted signal in the image domain to generate minimum phase of the signal; and applying an inverse Fourier transform to convert each signal with magnitude and minimum phase from the image domain back to k-space.

10. A method for parallel spatial encoding MR image data that is frequency-encoded by MR gradient and sensitivity-encoded by a plurality of RF detectors of an RF detector array, said method comprising the steps of:

applying an analytical transform function to generate weighting coefficients for a given spatial harmonic order and a given detector index;

generating linear combinations of the MR image data that is frequency-encoded and sensitivity-encoded to generate a set of spatial harmonics that can encode spatial frequencies; and applying at least a one-dimensional Fourier transform to a k-space data set in which spatial frequency dimensions are fully encoded, thereby resulting in an MR image of an object being observed.

11. The method of claim 10, wherein the analytical transform being applied comprises:

a numerator that is a complex exponential function having an exponent that is the product of $2\pi$, spatial harmonic order, RF detector index, RF detector spacing and reciprocal of the field-of view; and a denominator that is a Fourier transform of the sensitivity profile of the detector.

12. A method of magnetic resonance imaging of a continuous region of a body by conditioning nuclear spins and measuring RF signals indicative of the conditioned spins using a phased array of detectors, wherein the method includes performing multiple steps of spin conditioning and of collecting of RF measurement signal responses from the region, establishing an ordered data set of collected RF signals and performing a spatial transformation of the ordered data set to produce a magnetic resonance image of said region, wherein said performing a spatial transformation includes:

synchronizing phases of the RF signals from the phased detector array;

generating harmonics to replace phase-encoding steps;

combining the harmonics by interleaving them to form a set of fully encoded ordered data; and applying a Fourier Transform to the fully encoded ordered data to reconstruct the magnetic resonance image of the region.

13. The method of claim 12 wherein said synchronizing includes synchronizing the phases of the RF signals from the phased detector array using a Fourier-Transform-Hilbert Transform (FT-HT) phase correction process.

14. The method of claim 12, wherein said generating includes;

applying an analytical transform function to generate weighting coefficients for a given spatial harmonic order and a given detector index; and generating linear combinations of image data that is frequency-encoded and sensitivity-encoded to generate a set of spatial harmonics that can encode spatial frequencies.

15. The method of claim 14, wherein the analytical transform being applied comprises:

a numerator that is a complex exponential function having an exponent that is the product of $2\pi$, spatial harmonic order, RF detector index, RF detector spacing and reciprocal of the field-of view; and a denominator that is a Fourier transform of the sensitivity profile of the detector.

16. The method of claim 14, wherein, in the case where high order spatial harmonics are generated, said generating further comprises demodulating a modulation of the high order spatial harmonics.

17. The method of claim 16, wherein said demodulating includes:

applying a Fourier transform to composite spatial harmonics to determine a frequency and amplitude of a modulation component; and adding a compensation component to the generated high order spatial harmonics, where said compensation component has a same frequency and amplitude but opposite phase as with the modulation component.

18. An MR signal detection and image reconstruction apparatus, for reconstructing the image of a region of a body being scanned, comprising:

an MR signal detection device for detecting MR signals from the region being scanned including a plurality of detectors;

an image reconstruction device, operably coupled to the MR signal detection device, that processes the detected MR signals and provides an output representative of the reconstructed image; and a program code for execution within the image reconstruction device, said program code comprising criteria and a sequence of instructions, said criteria and sequence of instructions including:

acquiring one of a reference image or a sub-set of image data to obtain sensitivity profiles of the detectors;

acquiring partial gradient phase-encoded signals from the detectors for each slice of the region being scanned;

synchronizing phases of the MR signals from the plurality of detectors;

generating harmonics to replace phase-encoding steps;

combining the harmonics by interleaving them to form a set of fully encoded data; and applying a Fourier Transform to the fully encoded data to reconstruct the image.

19. The MR signal detection and image reconstruction apparatus of claim 18, wherein said synchronizing includes synchronizing the phases of the signals from the phased detector array using a Fourier-Transform-Hilbert Transform (FT-HT) phase correction process.

20. The MR signal detection and image reconstruction apparatus of claim 18, further comprising an apparatus for outputting the reconstructed image as a visible image.

21. The MR signal detection and image reconstruction apparatus of claim 18, wherein said generating includes;

applying an analytical transform function to generate weighting coefficients for a given spatial harmonic order and a given detector index; and generating linear combinations of image data that is frequency-encoded and sensitivity-encoded to generate a set of spatial harmonics that can encode spatial frequencies.

22. The MR signal detection and image reconstruction apparatus of claim 18, wherein said applying a Fourier Transform comprises applying a 2-dimensional (2D) Fourier Transform to the fully encoded data to reconstruct the image.

23. The MR signal detection and image reconstruction apparatus of claim 18, wherein said generating includes;

applying an analytical transform function to generate weighting coefficients for a given spatial harmonic order and a given detector index; and generating linear combinations of image data that is frequency-encoded and sensitivity-encoded to generate a set of spatial harmonics that can encode spatial frequencies.

24. The MR signal detection and image reconstruction apparatus of claim 23, wherein the analytical transform being applied comprises:

a numerator that is a complex exponential function having an exponent that is the product of $2\pi$, spatial harmonic order, RF detector index, RF detector spacing and reciprocal of the field-of view; and a denominator that is a Fourier transform of the sensitivity profile of the detectors.

25. The MR signal detection and image reconstruction apparatus of claim 23 wherein, in the case where high order spatial harmonics are generated, said generating further comprises demodulating a modulation of the high order spatial harmonics.

26. The MR signal detection and image reconstruction apparatus of claim 18, further comprising an RF transmitted that outputs RF signals at a desired frequency so as to cause nuclei within the region to resonate.

27. An MR imaging system, comprising an MR signal detection and image reconstruction apparatus, for reconstructing an image of a predetermined region of an object being scanned, comprising:

an MR signal detection device that detectings MR signals from the region being scanned, said detection device including a plurality of detectors;

an image reconstruction device, operably coupled to the MR signal detection device, that processes the detected MR signals and provides an output representative of the reconstructed image; and a program code for execution within the image reconstruction device, said program code comprising criteria and a sequence of instructions, said criteria and sequence of instructions including:

acquiring one of a reference image or a sub-set of image data to obtain sensitivity profiles of the detectors;

acquiring partial gradient phase-encoded signals from the detectors for each slice of the predetermined region;

synchronizing phases of the MR signals from the plurality of detectors;

generating harmonics to replace phase-encoding steps;

combining the harmonics by interleaving them to form a set of fully encoded data; and applying a Fourier Transform to the fully encoded data to reconstruct the image.

28. The MRI imaging system of claim 27 further comprising:

a main magnetic coil that generates a homogenous magnetic in each slice;

gradient coils that generate at least one additional magnetic field;

an RF transmitter that outputs RF signals at a desired frequency so as to cause nuclei within each slice to resonate; and controllers that control the operation and energization of the main and gradient coils, the generation of RF signals by the RF transmitter, and the detection of signals by the MR signal detection device.

* * * * *

UNITED STATES PATENT AND TRADEMARK OFFICE
CERTIFICATE OF CORRECTION

| | | |
|---|---|---|
| PATENT NO. | : 6,476,606 B2 | Page 1 of 1 |
| APPLICATION NO. | : 09/728948 | |
| DATED | : November 5, 2002 | |
| INVENTOR(S) | : Ray F. Lee | |

It is certified that error appears in the above-identified patent and that said Letters Patent is hereby corrected as shown below:

At the first page of the patent, please replace the following paragraph:

FEDERALLY SPONSORED RESEARCH OR DEVELOPMENT
This invention was made with Government support under HL056882, HL062332 awarded by the National Institutes of Health. The Government has certain rights in the invention.

Signed and Sealed this
Sixth Day of December, 2011

David J. Kappos
*Director of the United States Patent and Trademark Office*